United States Patent
Bafar et al.

(10) Patent No.: US 9,966,907 B1
(45) Date of Patent: May 8, 2018

(54) METHOD AND APPARATUS FOR HIGH-SPEED CLIPPING AND RECOVERY IN AMPLIFIER CIRCUIT

(71) Applicant: Apple Inc., Cupertino, CA (US)

(72) Inventors: Vahid Majidzadeh Bafar, Sunnyvale, CA (US); Ashkan Borna, Redmond, WA (US); Mansour Keramat, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days. days.

(21) Appl. No.: 15/426,111

(22) Filed: Feb. 7, 2017

(51) Int. Cl.
| | |
|---|---|
| *H03F 1/52* | (2006.01) |
| *H03F 1/34* | (2006.01) |
| *H03F 3/45* | (2006.01) |
| *H03F 3/08* | (2006.01) |

(52) U.S. Cl.
CPC .............. *H03F 1/52* (2013.01); *H03F 1/34* (2013.01); *H03F 3/45475* (2013.01); *H03F 2200/258* (2013.01); *H03F 2200/411* (2013.01)

(58) Field of Classification Search
USPC ......................................... 330/252–261, 308
See application file for complete search history.

(56) References Cited

U.S. PATENT DOCUMENTS

| | | | |
|---|---|---|---|
| 7,755,433 B2 | 7/2010 | Ikeda | |
| 7,973,602 B2* | 7/2011 | Shivaram | H03F 1/083 330/254 |
| 8,742,852 B2* | 6/2014 | Sugimoto | H03F 3/087 330/252 |
| 2006/0244541 A1 | 11/2006 | Mijuskovic | |
| 2015/0270808 A1 | 9/2015 | Sugimoto | |

* cited by examiner

*Primary Examiner* — Hieu Nguyen
(74) *Attorney, Agent, or Firm* — Meyertons, Hood, Kivlin, Kowert & Goetzel, P.C.; Erik A. Heter (57) ABSTRACT

A method and apparatus for high-speed clipping and recovery in an amplifier circuit is disclosed. In one embodiment, a circuit includes an amplifier configured to amplify an incoming signal. The amplifier includes inverting and non-inverting inputs, and is configured to provide a differential output. An output limiting circuit is coupled across the differential output, and is configured to limit an amplitude of an output signal provided on the differential output responsive to an input signal exceeding a first amplitude threshold. An input limiting circuit is coupled between the inverting input and the non-inverting input of the amplifier. Responsive to the input signal exceeding a second amplitude threshold (greater than the first), the input limiting circuit is configured to limit the amplitude of the output signal.

20 Claims, 6 Drawing Sheets

METHOD AND APPARATUS FOR HIGH-SPEED CLIPPING AND RECOVERY IN AMPLIFIER CIRCUIT

BACKGROUND

Technical Field

This disclosure is directed to amplifier circuits, and more particularly, clipping and recovery circuits implemented with amplifiers.

Description of the Related Art

Trans-impedance amplifiers are widely used in high-speed applications, such as optical front ends that convert an input current generated by optical excitation of photons in a photo diode into a voltage signal. In high-speed application, trans-impedance amplifiers may provide a wideband low input impedance to meet gain-bandwidth performance.

Linearity of a trans-impedance amplifier is also a consideration in applications in which the amplifier interfaces signal having a large dynamic range. In addition to gain and input impedance modulation of a trans-impedance amplifier with a large input signal, the bandwidth may be modulated by the large input signal. The large dynamic range of such an input signal can exceed the linear input range of the trans-impedance amplifier, at times by significant amounts. This is known as an overload condition. The overload condition may be of short duration. The speed at which the trans-impedance amplifier recovers to provide linear performance when the overload condition is diminished is referred to as recovery speed, and is an important consideration in high-speed applications.

To aid in recovery from overload conditions, some trans-impedance amplifiers may provide clipping protection circuits. Typically, these circuits are implemented on the output of a trans-impedance amplifier.

SUMMARY

A method and apparatus for high-speed clipping and recovery in an amplifier circuit is disclosed. In one embodiment, a circuit includes an amplifier configured to amplify an incoming signal. The amplifier includes inverting and non-inverting inputs, and is configured to provide a differential output. An output limiting circuit is coupled across the differential output, and is configured to limit an amplitude of an output signal provided on the differential output responsive to an input signal exceeding a first amplitude threshold. An input limiting circuit is coupled between the inverting input and the non-inverting input of the amplifier. Responsive to the input signal exceeding a second amplitude threshold (greater than the first), the input limiting circuit is configured to limit the amplitude of the output signal.

In one embodiment, the amplifier is a trans-impedance amplifier. The output limiting circuit the embodiment is configured to perform a comparison operation using a dynamic clipping level signal in order to limit the amplitude of the differential output signal. An input limiting circuit in the embodiment is configured to limit the amplitude of the output signal by injecting current into the inputs of the trans-impedance amplifier.

In one embodiment, an output signal from the output limiting circuit may modulate a voltage controlled resistor coupled between stages of the trans-impedance amplifier. The input limiting circuit may provide surge current during condition when the input signal exceeds the second amplitude threshold.

BRIEF DESCRIPTION OF THE DRAWINGS

The following detailed description makes reference to the accompanying drawings, which are now briefly described.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation [entity] configured to [perform one or more tasks] is used herein to refer to structure (i.e., something; physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. §112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION OF EMBODIMENTS

Figure 1:
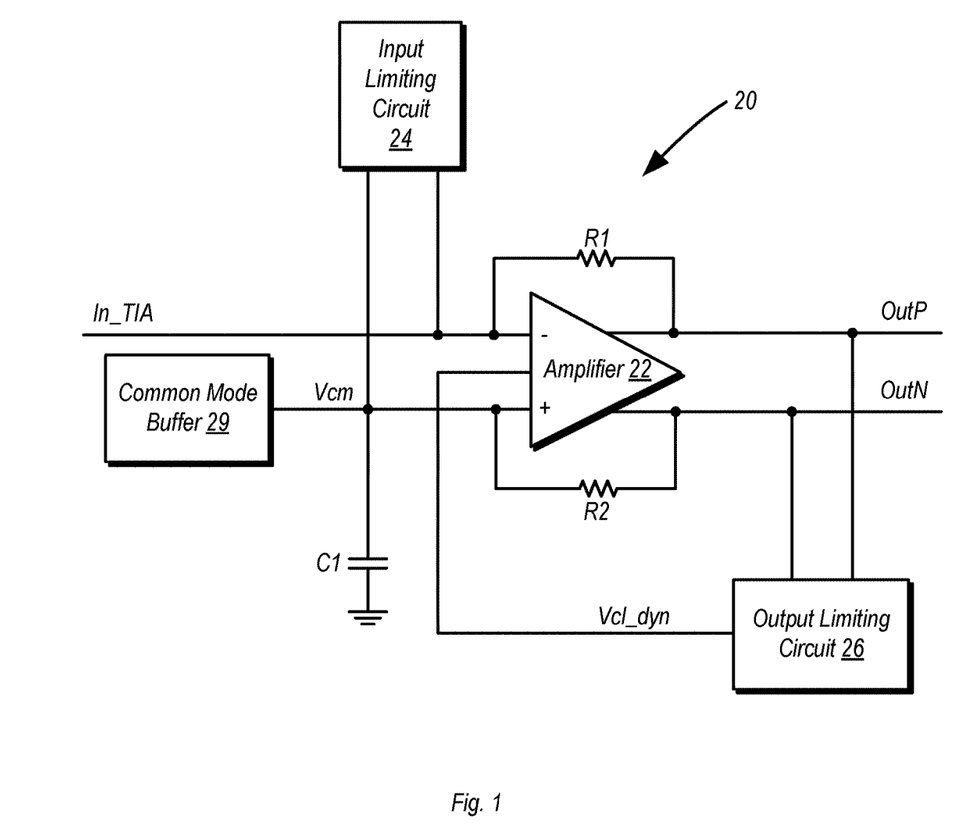
FIG. 1 is a diagram illustrating one embodiment of an amplifier circuit having an input limiting circuit and an output limiting circuit.

Turning now to FIG. 1, a diagram illustrating one embodiment of an amplifier circuit having an input limiting circuit and an output limiting circuit is shown. In the embodiment shown, circuit 20 includes an amplifier 22, which includes a differential input and a differential output. It is noted that while amplifier 22 is depicted as a single stage amplifier here, in various embodiments amplifier 22 may include multiple amplifier stages. In one embodiment, amplifier 22 may be a trans-impedance amplifier, and may be used in high-speed applications. However, the disclosure is not limited to trans-impedance amplifiers and/or high-speed applications, and may be applied to a wide variety of amplifier applications.

A common mode buffer (amplifier) 29 is coupled to provide a common mode voltage (Vcm) to the non-inverting (+) input of amplifier 22. In this embodiment, amplifier 22 is implemented as a trans-impedance amplifier, and is coupled to receive an input signal, In_TIA on its inverting input (−). Feedback resistor R1 is coupled between the positive output, OutP and the inverting input. Feedback resistor R2 is coupled between the negative output and the non-inverting input.

During operation, amplifier circuit may at times be subject to overloads, particularly in applications in which the input signal has a wide dynamic range. The large dynamic range signal may exceed the range at which amplifier circuit maintains linear operation, at times by one or more orders of magnitude. Furthermore, if the overload condition is severe enough, it can damage circuits following the amplifier, and in some cases, the amplifier itself. Accordingly, protection from such conditions may be provided in the form of limiting circuits.

Amplifier circuit 20 in the embodiment shown includes an input limiting circuit 24 and an output limiting circuit 26. These circuits may provide clipping of the input signal when it exceeds the dynamic range of amplifier 22. Additionally, these circuits may aid in recovery of amplifier 22 back to a region of linear operation.

Output limiting circuit 26 in the embodiment shown may limit an amplitude of an output signal provided on the differential output of amplifier 22 in response to the input signal exceeding a first amplitude threshold. Input limiting circuit 24 in the embodiment shown may limit the amplitude of the output signal provided by amplifier 22 responsive to the amplitude of the input signal exceeding a second threshold that is greater than the first. More generally speaking, output limiting circuit may provide moderate clipping, while input limiting circuit 24 provides deep clipping. Furthermore, this architecture may avoid extra input current entering the amplifier feedback loop. Accordingly, the devices utilized in the implemented may be physically designed for average operating conditions rather than for handling large surge currents. This in turn may minimize the area necessary to implement amplifier circuit 20, and may also help reduce parasitics relative to embodiments that do utilize this architecture.

Figure 2:
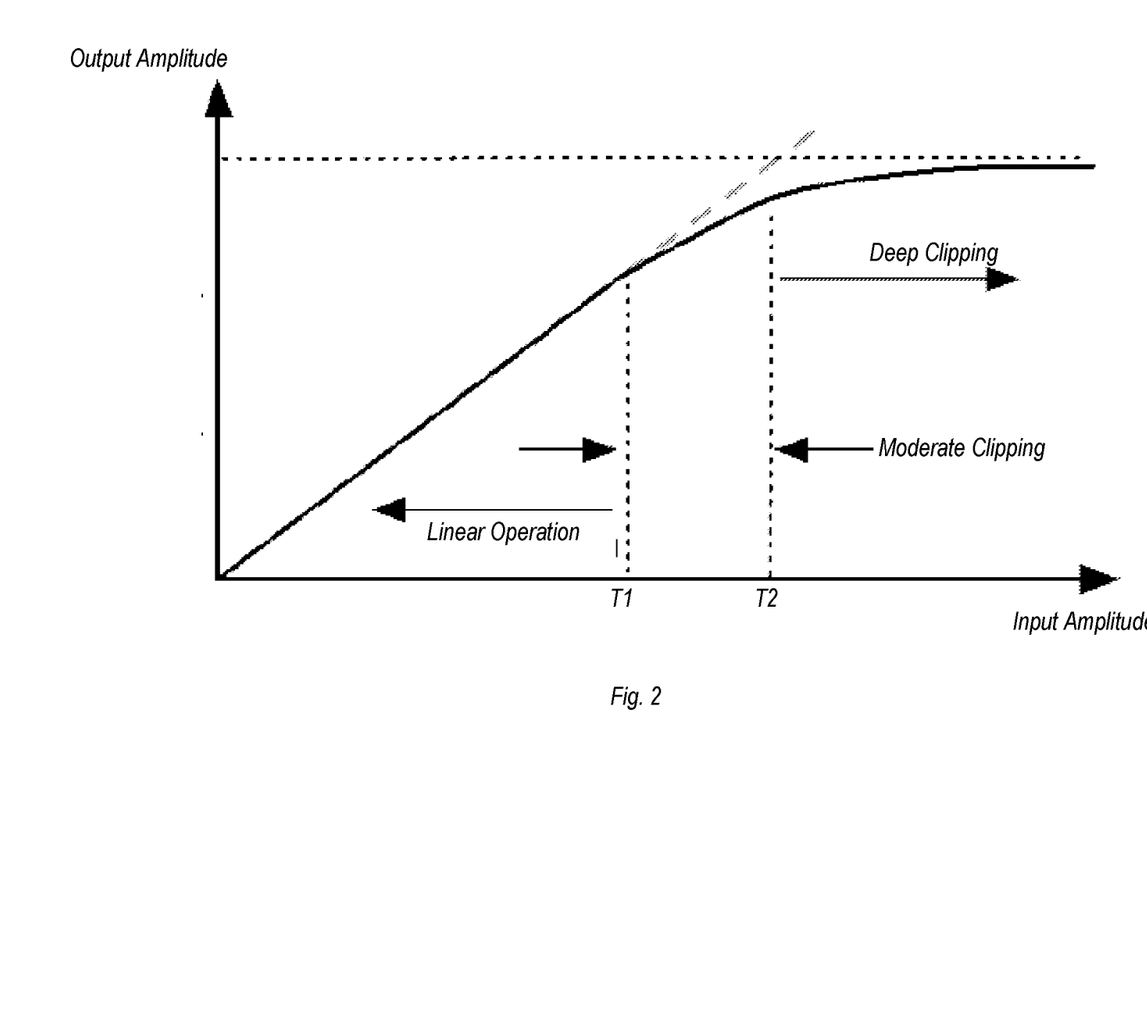
FIG. 2 is a graphic illustration of the operation of the embodiment of the trans-impedance amplifier of FIG. 1.

FIG. 2 graphically illustrates the operation of amplifier circuit 20 with relation to clipping due to an overload condition. More particularly, FIG. 2 illustrates the two-step clipping performed by the output and input limiting circuits.

When the amplitude of the input signal is below the first input amplitude threshold T1, amplifier circuit 20 operates in a linear fashion. In this region, the amplitude of the output signal is proportional to that of the input signal. This is the expected normal range of operation for amplifier circuit 20.

If the amplitude of the input signal exceeds the first amplitude threshold T1, but is below the second amplitude threshold T2, moderate clipping is performed. The moderate clipping is provided by the output limiting circuit. During moderate clipping, the amplitude of the output signal begins to taper off as the amplitude of the input signal increases, and thus the operation is no longer linear.

When the amplitude of the input signal exceeds the second amplitude threshold, deep clipping is performed. In this region, the amplitude of the output signal begins to flatten out with respect to the increasing amplitude of the input signal. While the output limiting circuit may contribute s, it is the input limiting circuit that provides the majority of the clipping in this region.

The overload conditions occurring when the amplitude of the input signal exceeds one or both thresholds may be short lived. However, it may take time for the operation of amplifier circuit to return to operation in the linear region. This is referred to as recovery time. Both output limiting circuit 26 and input limiting circuit 24 may aid to shorten the duration of the recovery time.

Figure 3:
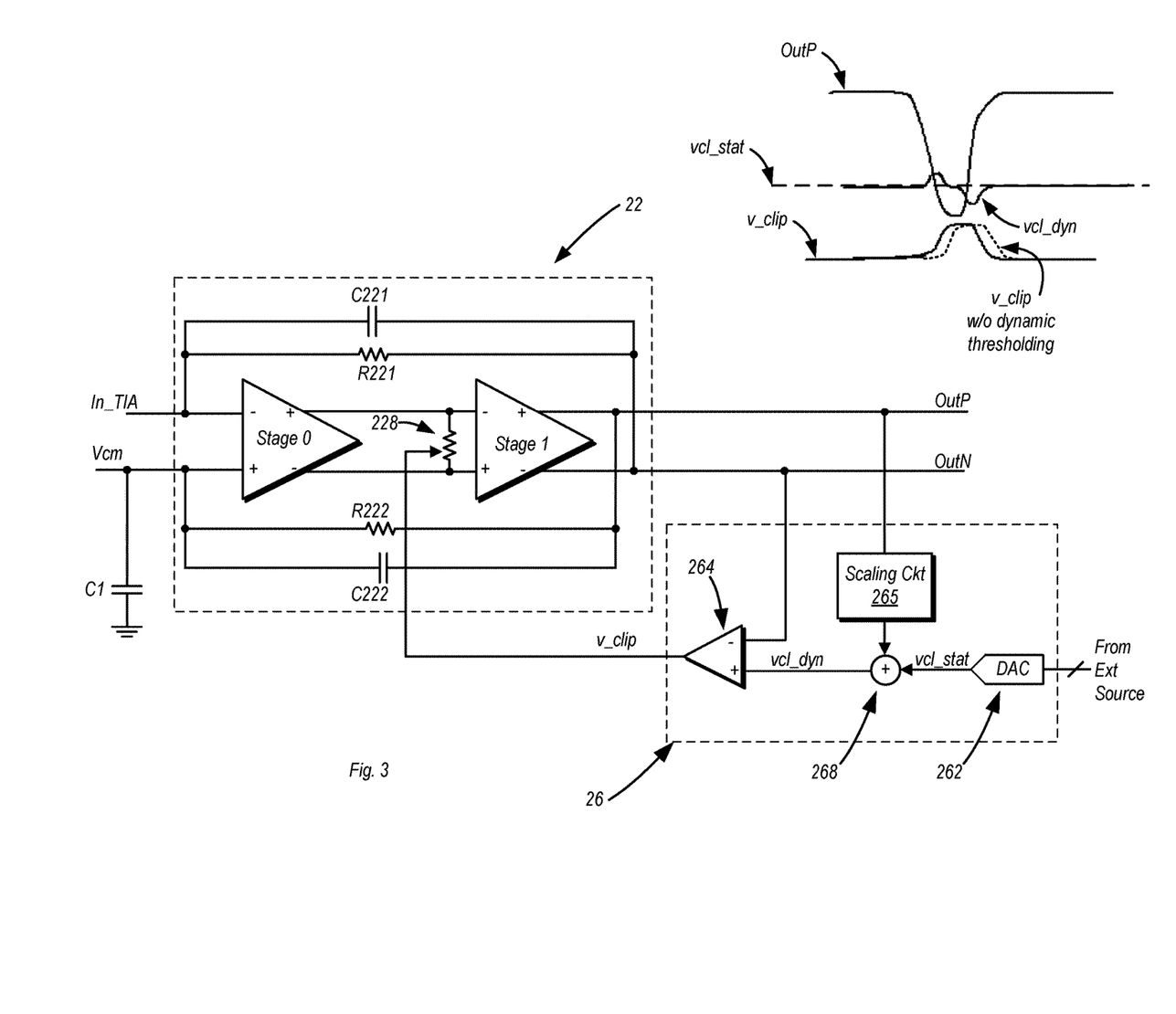
FIG. 3 is a diagram illustrating one embodiment of an output limiting circuit in relation to the stages of the amplifier circuit.

FIG. 3 is a diagram illustrating one embodiment of an output limiting circuit in relation to the stages of the amplifier circuit. High-speed clipping may be performed by the illustrated circuit architecture, which may mitigate delay that may be present due to limited feedback bandwidth. The architecture of output limiting circuit 26 in the illustrated embodiment may utilize predictive thresholding, as will be explained in further detail below.

Amplifier 22 in the embodiment shown is a two stage amplifier, namely stage 0 and stage 1. The inputs to stage 0 and the output from stage 1 are the same as those shown in the example of FIG. 1 (the common mode buffer is not shown here for the sake of simplicity). Additional feedback paths are provides between OutN and In_TIA (comprising R221 and C221) and OutP and Vcm (comprising R222 and C222). A voltage controlled resistor 22 is implemented in between stage 0 and stage 1, coupled between the inverting and non-inverting inputs of stage 1 (which are coupled to the positive and negatives outputs of stage 0, respectively).

Output limiting circuit 26 in the embodiment shown includes a scaling circuit 265, a digital-to-analog converter (DAC) 262, a summing circuit 268, and a wideband amplifier 264. The inverting input of wideband amplifier 264 is coupled to the negative output, OutN, of amplifier 22. The non-inverting input of wideband amplifier 264 is coupled to receive the output of summing circuit 268, which is an analog summing circuit. Summing circuit 268 is coupled to receive a static clipping voltage (vcl_stat) from DAC 262, which is generated using a digital code received from an external source (e.g., a control circuit, a fuse unit, or any other suitable mechanism). Summing circuit 268 is also coupled to receive a variable voltage input from scaling circuit 265. Scaling circuit 265 is coupled to the positive output, OutP, of amplifier 22, and is configured to scale the voltage received therefrom according to desired transfer function implemented by the circuitry therein. The circuitry to implement such a transfer function may utilize any suitable topology.

The output of the summing circuit 268 is a dynamic clipping voltage (vcl_dyn), which is the sum of the static clipping voltage from DAC 262 and the scaled version of OutP. Wideband amplifier 264 in the embodiment shown may effectively compare the negative output of amplifier 22 to the dynamic clipping voltage. The voltage signal output from wideband amplifier 264, v_clip, may modulate voltage controller resistor 228. By modulating the voltage controlled resistor 228, the gain and signal swing at the input of stage 1 may be controlled.

The operation of output limiting circuit 26 may be described as predictive thresholding, and is graphically illustrated in the upper-right portion of FIG. 3. As discussed above, the dynamic clipping voltage, vcl_dyn, is the sum of the scaled output and the static clipping voltage output from DAC 262. The static clipping voltage may be considered a base threshold upon which the predictive thresholding is performed. In the graphic illustration, as the overload condition causes OutP to fall, the dynamic clipping voltage begins a corresponding rise, leading to a rise in the clipping voltage v_clip. As OutP falls, vcl_dyn peaks shortly after these two signals cross in amplitude, and begins to fall thereafter. The clipping voltage v_clip modulates the voltage controlled resistor 228, and begins to flatten out at this time. Thereafter, OutP bottoms out and begins rising again. Subsequent to OutP and vcl_dyn crossing again, the latter returns to a stable level, and thus v_clip begins falling again, as the circuit returns to linear operation. This type of operation may improve the phase margin of the output limiting loop implemented by output limning circuit 26 by creating a hysteresis around the static clipping voltage. For comparison purposes, v_clip without the use of dynamic thresholding is shown in dashed lines on the graph.

Figure 4:
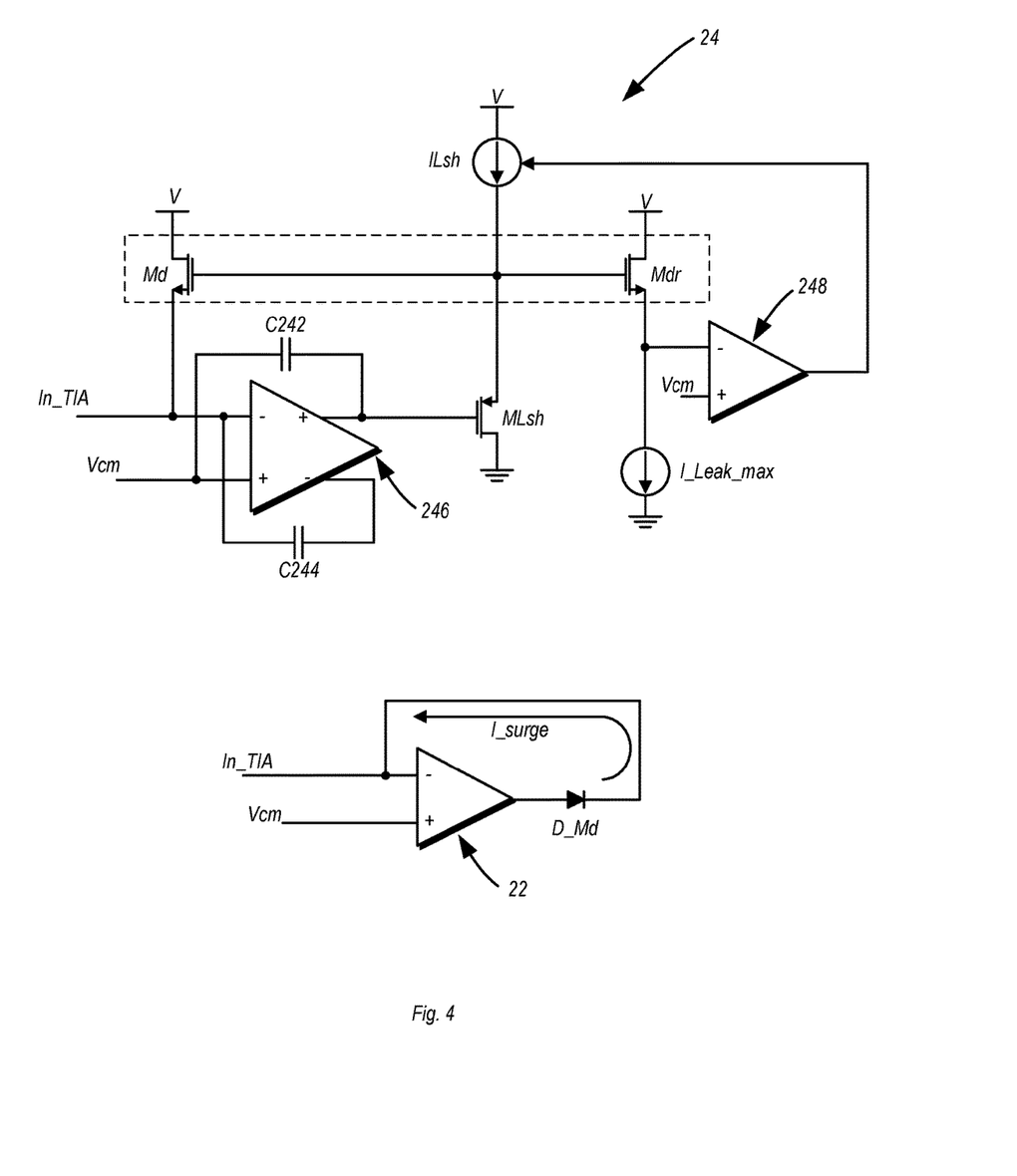
FIG. 4 is a diagram illustrating one embodiment of an input limiting circuit.

FIG. 4 is a diagram illustrating one embodiment of an input limiting circuit. In the embodiment shown, input limiting circuit 24 includes amplifiers 246 and 248. Amplifier 246 is a wideband amplifier having its inputs coupled to receive the same input signals as amplifier 22 discussed above. The positive output of amplifier 246 is coupled to the gate terminal of PMOS transistor MLsh. A first feedback loop capacitively couples (via C242) the positive output of amplifier 246 to its non-inverting input, while a second feedback loop capacitively couples (via C244) the negative output to the inverting input. The capacitances in these feedback loops are Miller capacitances, and may at least partially cancel out additional parasitics at the input of amplifier 246 while minimizing the overall noise penalty of input limiting circuit 24.

Amplifier 248 in the embodiment shown is coupled to receive the common mode voltage on its non-inverting input, while its inverting input is coupled to the source terminal of NMOS device Mdr. The output of amplifier 248 is a single-ended output, and is used to control current source ILsh. Transistors Mdr and Md, each of which has a gate terminal coupled to the output of current source ILsh, form a replica circuit. Transistor Md in the embodiment shown may act as a diode. In order to ensure that transistor Md does not turn on when operating in the linear mode, transistor Mdr acts as a replica device that is biased at a controlled bias current, I_leak_mask (represented by the current source of the same name in the drawing). The current I_leak_mask may define the maximum allowable leakage current through transistor Md under any PVT (process, voltage, temperature) condition due to low-frequency and high-gain feedback operation. The feedback from the output of amplifier 248 may tune the current ILsh of transistor MLsh, which may act as a level shifter in the illustrated embodiment. Accordingly, the source of transistor Mdr may track the slow varying amplifier input In_TIA. Since the gate and source voltages of transistors Md and Mdr are substantially identical, and the devices are matched, the leakage current of transistor Md may closely follow that of transistor Mdr (I_leak_max).

During operation, input limiting circuit 24 may provide surge current when the input signal is in an over-range condition, while avoiding excessive current flowing into amplifier 22. Input limiting circuit 24 may thus be a non-linear circuit that acts as a pseudo-ideal diode with a reduced threshold by a factor of the wideband amplifier gain. This diode, implemented via transistor Md as discussed above, may remain off during the linear mode, turning on and supplying surge current to the input of amplifier 22 during the deep clipping and the drooping of the input In_TIA. As discussed above, the transistor Mdr may operate to ensure that Md is not turned on during the linear mode of operation, irrespective of PVT conditions.

The operation of input limiting circuit 24 is illustrated conceptually in the lower portion of FIG. 4 as an amplifier with a diode coupled to its output. In the conceptual example, when amplifier 22 is operating in the linear range, diode D_Md is turned off, and surge current (I_surge) is zero. However, when an overload condition of sufficient magnitude occurs, the voltage on the output of amplifier 22 may be driven to a value sufficient to forward bias D_Md, thereby resulting in surge current I_surge being provided to the inverting input of amplifier 22. This eventually causes recovery from the overload condition, which culminates in turning off diode D_md as operation returns to the linear region. The equivalent to the diode in the actual circuit is transistor Md, which is activated responsive to an overload condition of sufficient magnitude, thereby adding current to In_TIA such that the inverting input is driven in a manner to return amplifier 22 back toward the linear region of operation. Driving the surge current to In_TIA may also limit the amplitude of the output signal provided by amplifier 22.

Figure 5:
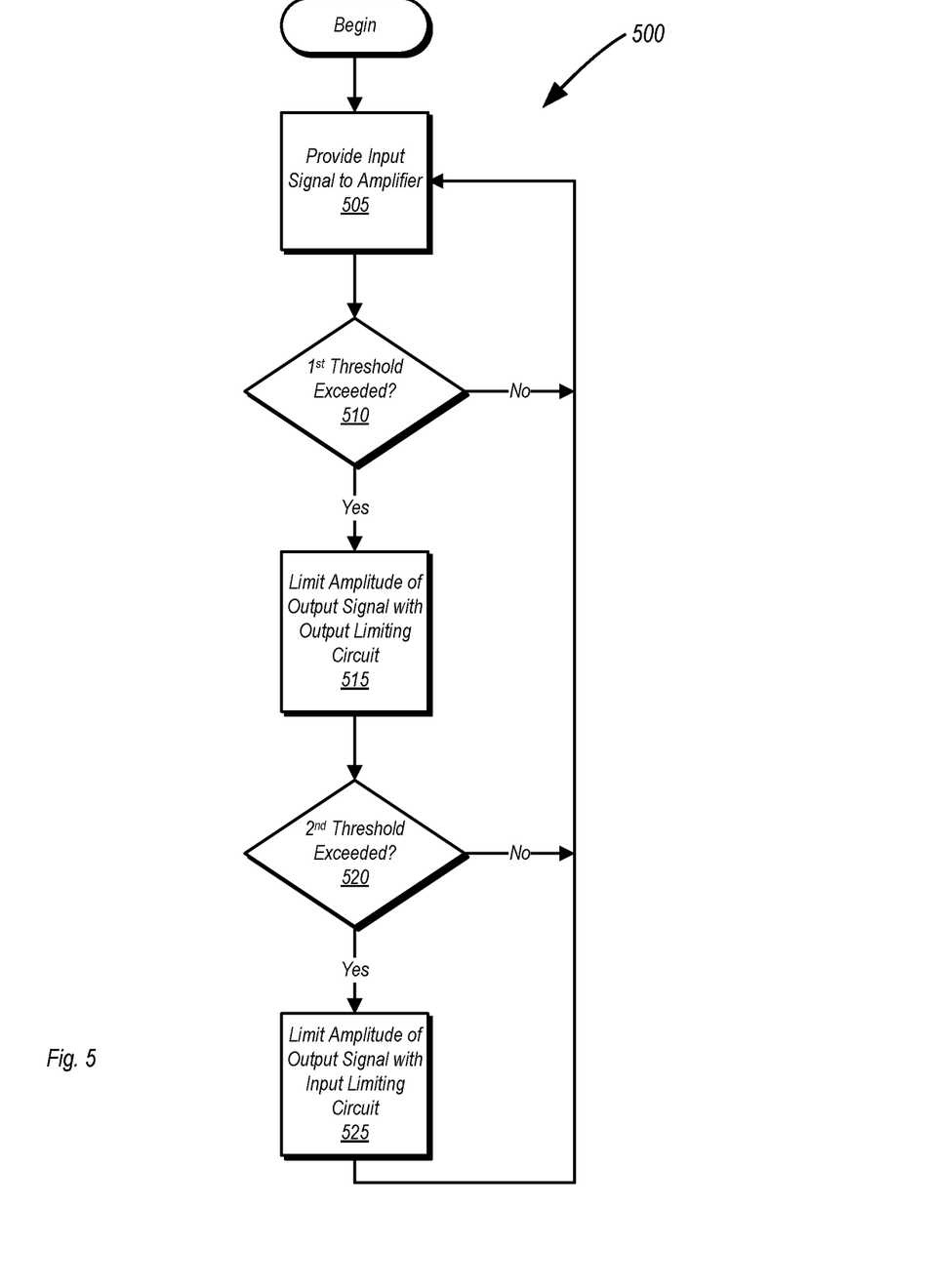
FIG. 5 is a flow diagram illustrating operation of one embodiment an amplifier having input and output limiting circuits.

FIG. 5 is a flow diagram illustrating operation of one embodiment of an amplifier circuit having input and output limiting circuits. Method 500 may be used with any of the circuit embodiments discussed above. It is further contemplated that method 500 may be utilized with circuit embodiments not explicitly disclosed herein, particular those in which one or both of the input and output limiting circuits have different topologies than those discussed herein.

Method 500 includes the providing of an input signal to an amplifier circuit (block 505). The amplifier circuit may be a differential amplifier that includes an inverting input and a non-inverting input. With regard to the input signal provided thereto, if a first amplitude threshold is exceeded (block 510, yes), the amplitude of the output signal may be limited by an output limiting circuit (block 515). As shown above, the output limiting circuit may be coupled to the output of the amplifier.

If the second amplitude threshold (with regard to the input signal) has not been exceeded (block 520, no), then operation may continue with the output limiting circuit limiting the amplitude of the output signal until operation returns to the linear region. However, if the second amplitude threshold is exceeded (block 520, yes), then the amplitude of the output signal may be limited by an output limiting circuit (block 525). Method 500 may then return to block 505, and may repeat the full cycle if the amplitude of the input signal continues to exceed the second amplitude threshold. If the amplitude falls below the second threshold, but continues to exceed the first threshold, the output limiting circuit may continue operating to reduce the amplitude of the output signal, while the input limiting circuit ceases to do so. During normal, linear operation of the amplifier, method 500 may cycle in a loop from block 505, to block 510, no, and back to block 505, as the first threshold is not exceeded when operating in the linear region.

Figure 6:
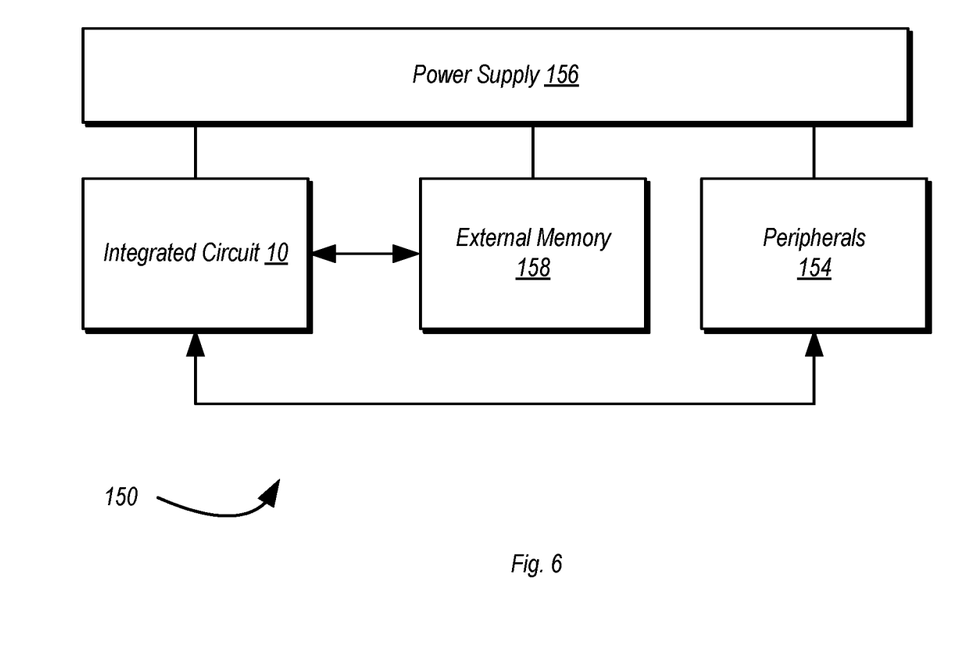
FIG. 6 is a block diagram of one embodiment of an exemplary system.

Turning next to FIG. 6, a block diagram of one embodiment of a system 150 is shown. In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. A circuit comprising:
   a first amplifier having an inverting input and a non-inverting input, wherein the amplifier further includes a differential output;
   an output limiting circuit coupled across the differential output, wherein the output limiting circuit is configured to limit an amplitude of an output signal provided on the differential output responsive to an input signal exceeding a first amplitude threshold; and
   an input limiting circuit coupled between the inverting input and the non-inverting input, wherein the input limiting circuit is configured to limit the amplitude of the output signal responsive to the input signal exceeding a second amplitude threshold, the second amplitude threshold being greater than the first amplitude threshold.

2. The circuit as recited in claim 1, wherein the input limiting circuit is configured to inject current into an input of the first amplifier responsive to the input signal exceeding the second amplitude threshold.

3. The circuit as recited in claim 1, wherein the output limiting circuit is configured to compare the amplitude of output signal to a dynamic clipping level.

4. The circuit as recited in claim 3, wherein the output limiting circuit includes a wideband amplifier having inverting and non-inverting inputs, wherein the non-inverting input of the wideband amplifier is coupled to receive a signal that is an analog sum of a static clipping level signal and scaled version of a positive portion of the output signal, and wherein the inverting input of the wideband amplifier is coupled to receive a negative portion of the output signal.

5. The circuit as recited in claim 4, wherein the output limiting circuit includes a digital-to-analog converter (DAC) coupled to receive a digital code corresponding to a static clipping level, and a scaling circuit configured to scale the positive portion of the output signal.

6. The circuit as recited in claim 5, wherein the output limiting circuit includes a summing circuit configured to generate the analog sum based on outputs from the DAC and the scaling circuit.

7. The circuit as recited in claim 1, wherein the input limiting circuit comprises a first stage implemented using a wideband amplifier and a second stage implemented using an operational amplifier having a single-ended output.

8. The circuit as recited in claim 7, wherein the input limiting circuit further comprises a first current source, a first transistor, and a second transistor, wherein respective gate terminals of the first and second transistors are coupled to an output of the first current source, wherein a source terminal of the first transistor is coupled to an inverting input of the wideband amplifier, and wherein a source terminal of the second transistor is coupled to an inverting input of the operational amplifier.

9. The circuit as recited in claim 8, wherein the input limiting circuit further comprises:
a third transistor having a source terminal coupled to the output of the current source and a gate terminal coupled to a positive output of the wideband amplifier.

10. The circuit as recited in claim 7, wherein the wideband amplifier includes an inverting input, a non-inverting input, and a differential output having a positive output and a negative output, wherein the inverting input of the wideband amplifier is coupled to the inverting input of the first amplifier and capacitively coupled to the negative output, and wherein the non-inverting input of the wideband amplifier is capacitively coupled to the negative output.

11. A method comprising:
providing an input signal to a first amplifier having an inverting input, a non-inverting input, and a differential output;
limiting, using an output limiting circuit, an amplitude of an output signal provided on the differential output responsive to the input signal exceeding a first amplitude threshold, the output limiting circuit being coupled across the differential input; and
limiting the amplitude of the output signal, using an input limiting circuit responsive to the input signal exceeding a second amplitude threshold, the second amplitude threshold being greater than the first amplitude threshold, the input limiting circuit being coupled between the inverting input and the non-inverting input.

12. The method as recited in claim 11, further comprising the input limiting circuit injecting current into inputs of the first amplifier responsive to the input signal exceeding the second amplitude threshold.

13. The method as recited in claim 11, further comprising:
the output limiting generating a scaled version of the output signal;
outputting, from a digital-to-analog converter (DAC), a static signal;
generating an analog sum of the static signal and the scaled version of the output signal;
providing the analog sum to a non-inverting input of a wideband amplifier implemented in the output limiting circuit; and
providing a negative portion of the output signal to an inverting input of the wideband amplifier.

14. The method as recited in claim 13, further comprising a comparison signal output from the wideband amplifier modulating a voltage-controlled resistor to control gain of an output stage of the first amplifier.

15. The method as recited in claim 13, further comprising providing a digital code to the DAC, the digital code being indicative of a desired amplitude level of the static signal.

16. An amplifier circuit comprising:
a first wideband amplifier having an inverting input and a non-inverting input, wherein the non-inverting input is coupled to a common mode buffer, wherein the first wideband amplifier is configured to provide a differential output signal on a differential output, and wherein the first wideband amplifier includes an input stage and an output stage;
an output limiting circuit coupled across the differential output and configured to limit an amplitude of the differential output signal responsive to an input signal to the first wideband amplifier exceeding a first amplitude threshold, the output limiting circuit having a second wideband amplifier configured to output a control signal to a voltage controlled resistor in the first wideband amplifier; and
an input limiting circuit coupled between the inverting input and the non-inverting input of the first wideband amplifier, the input limiting circuit is configured to limit the amplitude of the output signal responsive to the input signal exceeding a second amplitude threshold, the second amplitude threshold being greater than the first amplitude threshold.

17. The amplifier circuit as recited in claim 16, wherein the input limiting circuit includes a first stage implemented using a third wideband amplifier and a second stage implemented using an operational amplifier having a single-ended output, and further includes a first current source, a first transistor, and a second transistor, wherein respective gate terminals of the first and second transistors are coupled to an output of the first current source, wherein a source terminal of the first transistor is coupled to an inverting input of the wideband amplifier, and wherein a source terminal of the second transistor is coupled to an inverting input of the operational amplifier.

18. The amplifier circuit as recited in claim 17, wherein the input limiting circuit is configured to inject current into an input of the first wideband amplifier responsive to the input signal exceeding the second amplitude threshold.

19. The amplifier circuit as recited in claim 17, wherein the output limiting circuit includes a fourth wideband amplifier having inverting and non-inverting inputs, wherein the non-inverting input is coupled to receive a signal from a positive output of the amplifier that is an analog sum of a static clipping level and scaled version of a positive portion of the output signal, and wherein the inverting input of the wideband amplifier is coupled to receive a negative portion of the output signal.

20. The amplifier circuit as recited in claim 19, wherein the output limiting circuit includes a digital-to-analog converter (DAC) coupled to receive a digital code corresponding to a static clipping level, a scaling circuit configured to scale the positive portion of the differential output signal from the first wideband amplifier, and a summing circuit configured to generate the analog sum based on outputs from the DAC and the scaling circuit.

* * * * *